(12) United States Patent
Zhou et al.

(10) Patent No.: US 12,720,777 B2
(45) Date of Patent: Aug. 25, 2026

(54) RESISTOR STRUCTURE IN INTEGRATED CIRCUIT

(71) Applicant: INTERNATIONAL BUSINESS MACHINES CORPORATION, Armonk, NY (US)

(72) Inventors: Huimei Zhou, Albany, NY (US); Baozhen Li, South Burlington, VT (US); Chih-Chao Yang, Glenmont, NY (US); Ashim Dutta, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 542 days.

(21) Appl. No.: 17/662,439

(22) Filed: May 9, 2022

(65) Prior Publication Data

US 2023/0361158 A1 Nov. 9, 2023

(51) Int. Cl.

| | |
|---|---|
| ***H10D 1/47*** | (2025.01) |
| ***H01C 17/06*** | (2006.01) |
| ***H10W 20/40*** | (2026.01) |
| ***H10W 20/42*** | (2026.01) |
| ***H10W 20/47*** | (2026.01) |

(52) U.S. Cl.

CPC ............. *H10D 1/474* (2025.01); *H01C 17/06* (2013.01); *H10W 20/42* (2026.01); *H10W 20/47* (2026.01); *H10W 20/498* (2026.01)

(58) Field of Classification Search

CPC .... H01C 17/06; H10D 1/474; H01L 23/5226; H01L 23/5228

See application file for complete search history.

(56) References Cited

U.S. PATENT DOCUMENTS

| | | | | |
|---|---|---|---|---|
| 6,703,666 | B1 * | 3/2004 | Huttemann | H01L 23/5228 257/E27.047 |
| 7,022,246 | B2 | 4/2006 | Chinthakindi | |
| 7,166,913 | B2 | 1/2007 | Chinthakindi | |
| 8,053,870 | B2 * | 11/2011 | Anderson | H01L 23/53295 257/637 |
| 8,298,902 | B2 | 10/2012 | Dalton | |
| 8,421,128 | B2 | 4/2013 | Abou-Khalil | |
| 8,470,682 | B2 | 6/2013 | Anderson | |
| 9,385,087 | B2 | 7/2016 | Chakraborty | |
| 9,923,046 | B1 | 3/2018 | Zang | |
| 2008/0237800 | A1 | 10/2008 | Chinthakindi | |
| 2014/0027762 | A1 * | 1/2014 | Tsurume | H10D 30/6757 257/43 |

(Continued)

OTHER PUBLICATIONS

Disclosed Anonymously, "Method and System for Creating Poly Resistors with Increased Thermal Dissipation Using Nitride Films", IPCOM000195540D, May 4, 2010, pp. 1-3.

*Primary Examiner* — Kyung S Lee
(74) *Attorney, Agent, or Firm* — Yuanmin Cai

(57) ABSTRACT

Embodiments of present invention provide a resistor structure. The resistor structure includes a first layer of electrically insulating material; and a second layer of resistive material directly adjacent to the first layer, wherein thermal conductivity of the first layer is equal to or larger than 100 W/m/K. In one embodiment, the first layer of electrically insulating material has a band gap equal to or larger than 4 eV and is selected from a group consisting of aluminum-nitride (AlN), boron-nitride (BN), and diamond (C).

17 Claims, 5 Drawing Sheets

(56) References Cited

U.S. PATENT DOCUMENTS

| | | | | |
|---|---|---|---|---|
| 2014/0183545 | A1* | 7/2014 | Hoke | H10D 62/8503 438/478 |
| 2019/0304905 | A1 | 10/2019 | Wee | |
| 2022/0359387 | A1* | 11/2022 | Chan | H01L 23/5226 |
| 2023/0197606 | A1* | 6/2023 | Li | H10D 1/474 257/536 |
| 2023/0335488 | A1* | 10/2023 | Hsiao | H10D 1/474 |

* cited by examiner

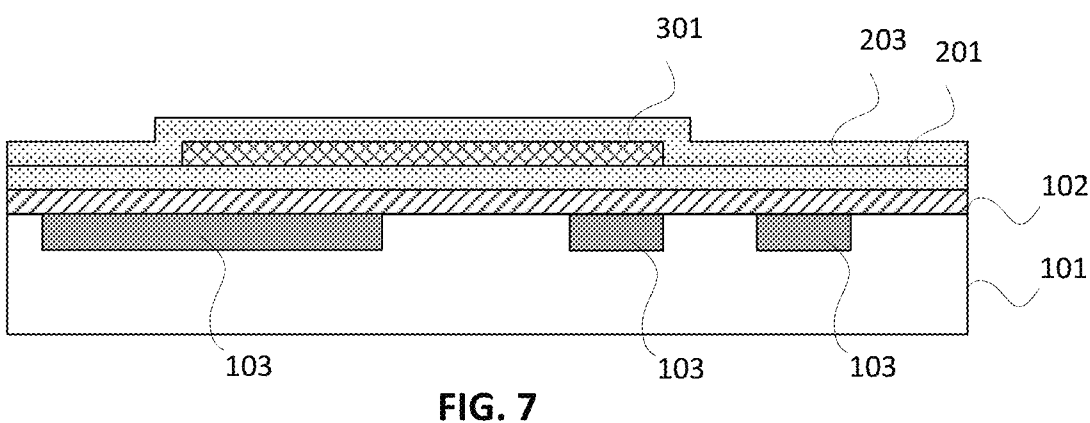
FIG. 7
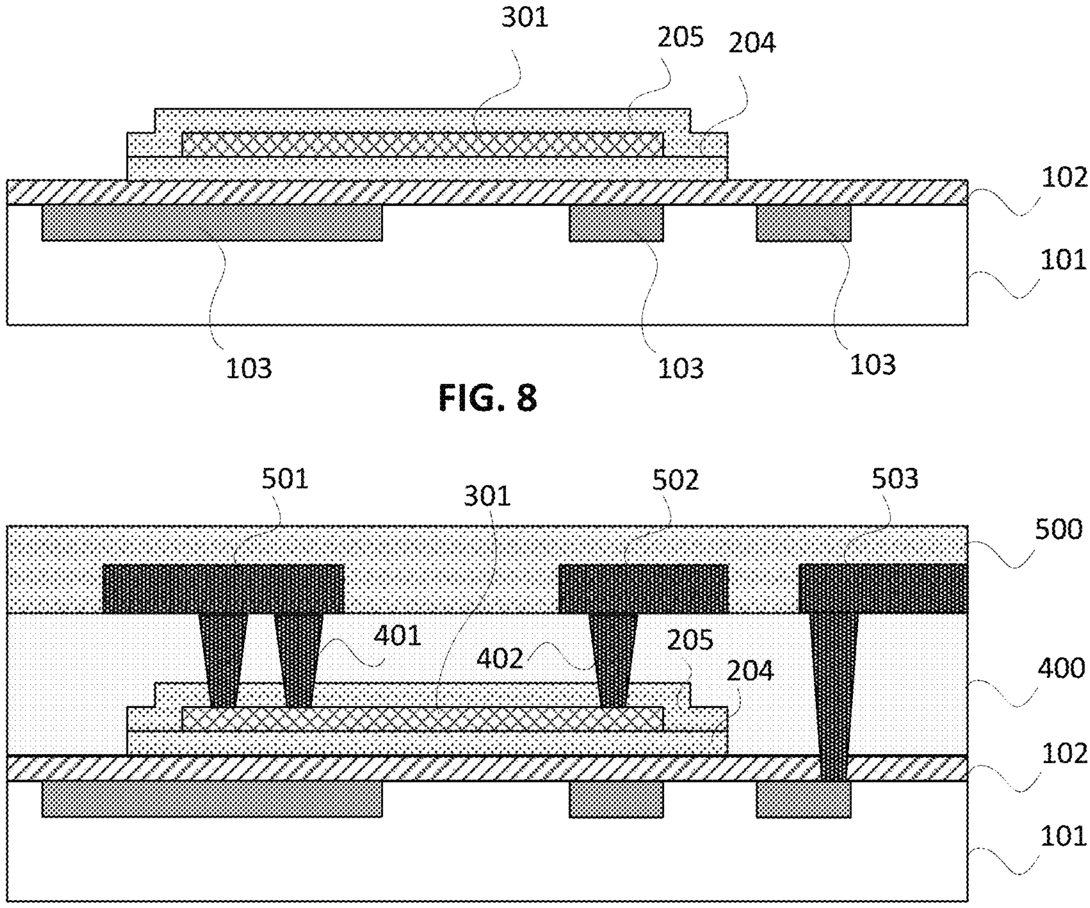
FIG. 8
FIG. 9

RESISTOR STRUCTURE IN INTEGRATED CIRCUIT

BACKGROUND

The present application relates to manufacturing of semiconductor integrated circuits. More particularly, it relates to resistor structures and method of making the same.

In modern integrated circuits, resistors are often used in middle-of-line (MOL) and more recently back-end-of-line (BEOL) areas of a semiconductor chip in the configuration of various functional circuitry blocks and play an integral part of roles in the modern integrated circuits.

As a general trend, with the introduction of advanced technology nodes, resistors are moving from MOL (as MOL resistor) to BEOL (as BEOL resistor) for various good reasons. On the other hand, there are concerns and/or issues with BEOL resistors, and one of which is Joule heating caused by the BEOL resistors. This is because, in the BEOL area that is further away from the substrate than MOL, resistors are more likely to be surrounded by low-k dielectric materials that are known for their poor thermal conductivity. For example, BEOL resistors normally demonstrate poorer thermal dissipation when being compared with MOL resistors.

To address the thermal dissipation concern, mitigating approaches that are currently known and/or used include limiting the electrical current that is allowed to pass through the resistor; setting an exclusion zone for metal wiring; and derating the electromigration limit for the connecting via and/or lines. Nevertheless, all these approaches compromise the overall semiconductor chip performance where BEOL resistors are used.

SUMMARY

Embodiments of present invention provide a resistor structure. The resistor structure includes a first layer of electrically insulating material; and a second layer of resistive material directly adjacent to the first layer, wherein thermal conductivity of the first layer is equal to or larger than 100 W/m/K.

In one embodiment, the first layer of electrically insulating material has a band gap equal to or larger than 4 eV.

In another embodiment, the first layer of electrically insulating material is selected from a group consisting of aluminum-nitride (AlN), boron-nitride (BN), and diamond (C).

Embodiments of present invention provide a method of forming a resistor structure. The method includes forming a first layer of electrically insulating material on top of a supporting structure; forming a second layer of resistive material directly on top of and in contact with the first layer of electrically insulating material; and forming a first and a second via contact in contact with the second layer of resistive material, wherein the first layer of electrically insulating material has a thermal conductivity equal to or larger than 100 W/m/K and a band gap equal to or larger than 4 eV.

BRIEF DESCRIPTION OF THE DRAWINGS

The present invention will be understood and appreciated more fully from the following detailed description of embodiments of present invention, taken in conjunction with accompanying drawings of which:

FIGS. 7-9 are demonstrative illustrations of cross-sectional views of a resistor structure during a process of manufacturing thereof, following the step illustrated in FIG. 3, according to another embodiment of present invention;

Figure 1:
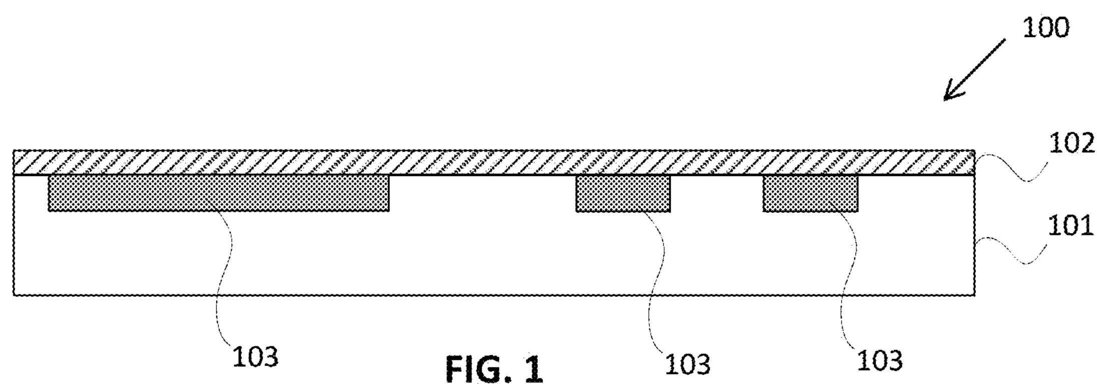
FIGS. 1-6 are demonstrative illustrations of cross-sectional views of a resistor structure during a process of manufacturing thereof according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms “about” or “substantially” as used herein with regard to thicknesses, widths, percentages, ranges, etc., are meant to denote being close or approximate to, but not exactly. For example, the term “about” or “substantially” as used herein implies that a small margin of error may be present such as, by way of example only, 1% or less than the stated amount. Likewise, the terms “on”, “over”, or “on top of” that are used herein to describe a positional relationship between two layers or structures are intended to be broadly construed and should not be interpreted as precluding the presence of one or more intervening layers or structures.

Moreover, the same or similar reference numbers are used throughout the drawings to denote the same or similar features, elements, or structures, and thus, a detailed explanation of the same or similar features, elements, or structures may not be repeated for each of the drawings for economy of description.

FIGS. 1-6 are demonstrative illustrations of cross-sectional views of a resistor structure during a process of manufacturing thereof according to one embodiment of present invention. More particularly, FIG. 1 illustrates a supporting structure 100 that includes a dielectric layer 101 within which one or more metal lines 103 are formed or embedded. The supporting structure 100 may also include a dielectric cap layer 102 on top of the dielectric layer 101. The dielectric cap layer 102 may be a silicon-nitride (SiN) layer, a silicon-oxide (SiO) layer, a silicon-borocarbonitride (SiBCN) layer, a silicon-oxycarbonitride (SiOCN) layer, or a layer made of any other suitable material.

Figure 2:
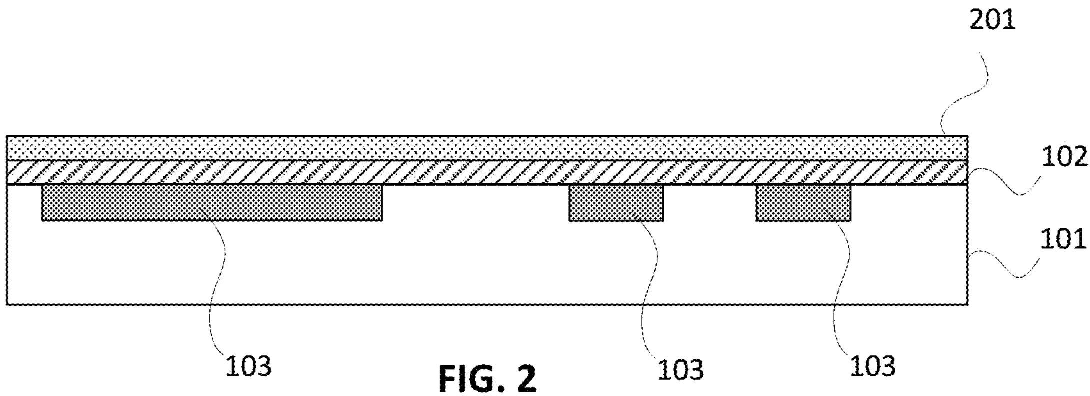

As being illustrated in FIG. 2, one embodiment of present invention includes depositing a first layer 201 of electrically insulating material with high thermal conductivity on top of the dielectric cap layer 102. The first layer 201 may have a thermal conductivity of at least 100 W/m/K and thereby be considered as having high thermal conductivity. The first layer 201 may also have a band gap of at least 4 eV and thereby be considered as electrically insulative. In one embodiment, the first layer 201 may include materials such as, for example, aluminum-nitride (AlN), boron-nitride (BN), and diamond (C), to name a few. However, embodiments of present invention are not limited in this aspect and other types of highly thermally conductive materials which are at the same time electrically insulative may be used. In particular, those materials that may be considered as having high thermal conductivity, i.e., with a value equal to or larger than 100 W/m/K, and electrically insulative, i.e., with a band gap equal to or larger than 4 eV, are particularly preferable as a suitable candidate for the first layer 201. The first layer 201 may be deposited to have a thickness of at least 5 nm. For example, the first layer 201 may have a thickness between 5 nm and 500 nm.

Figure 3:
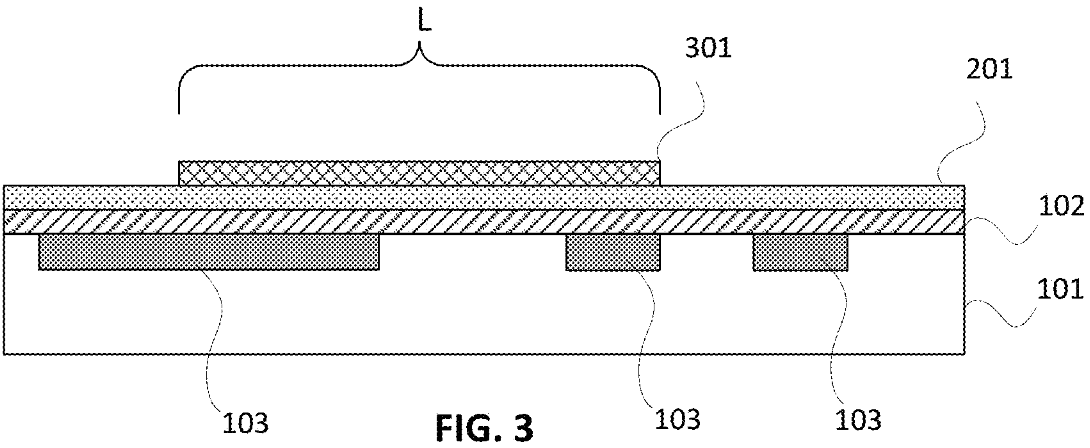

As being illustrated in FIG. 3, one embodiment of present invention provides forming a second layer 301, which is a layer of resistive material, that forms a resistor directly on top of and in contact with the first layer 201 of electrically insulating material with high thermal conductivity. For example, the second layer 301 may be a layer of titanium-nitride (TiN), tantalum-nitride (TaN), titanium-aluminum-nitride (TiAlN), silicon-chromium (SiCr), and/or other silicide materials. The second layer 301 may be formed to have a thickness of about 10 to 200 nm, a width (into the paper) of about 100 nm or more and a length L of about 180 nm or more. The second layer 301 may have a surface area smaller than the first layer 201. However, embodiments of present invention are not limited in this aspect and the second layer 301 of resistive material may have different dimensions, i.e., thickness, width, and length, according to various functional requirements and design. All these different dimensions are fully contemplated here according to embodiments of present invention.

Figure 4:
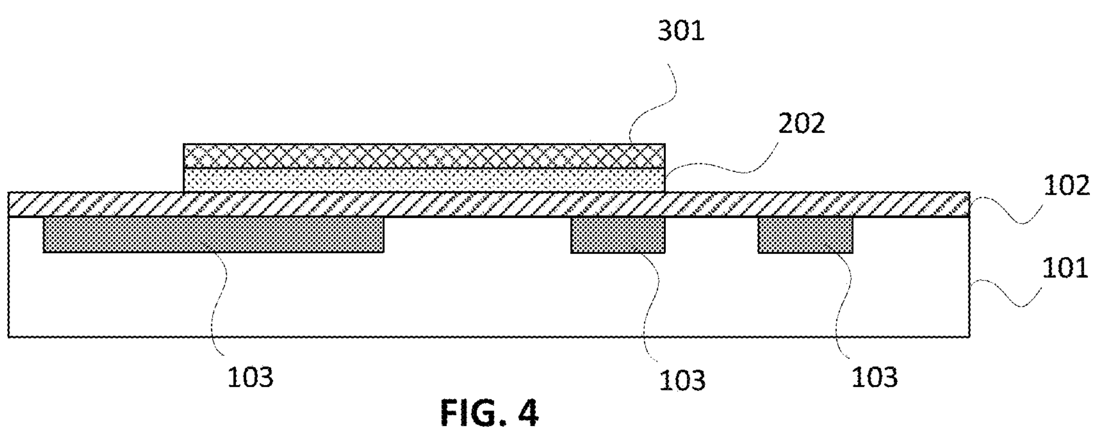

As being illustrated in FIG. 4, after forming the second layer 301 of resistive material, embodiment of present invention may include selectively etching the first layer 201, such that the first layer 201 becomes a layer 202 that has a same surface area as that of the second layer 301. However, embodiments of present invention are not limited in this aspect. For example, in one embodiment, as being described below in more details with reference to FIG. 10, the first layer 201 may be etched but still have larger areas than that of the second layer 301. In another embodiment, as being described below in more details with reference to FIG. 11, no etching of the first layer 201 may be performed and the first layer 201 may be used as it is deposited.

Figure 5:
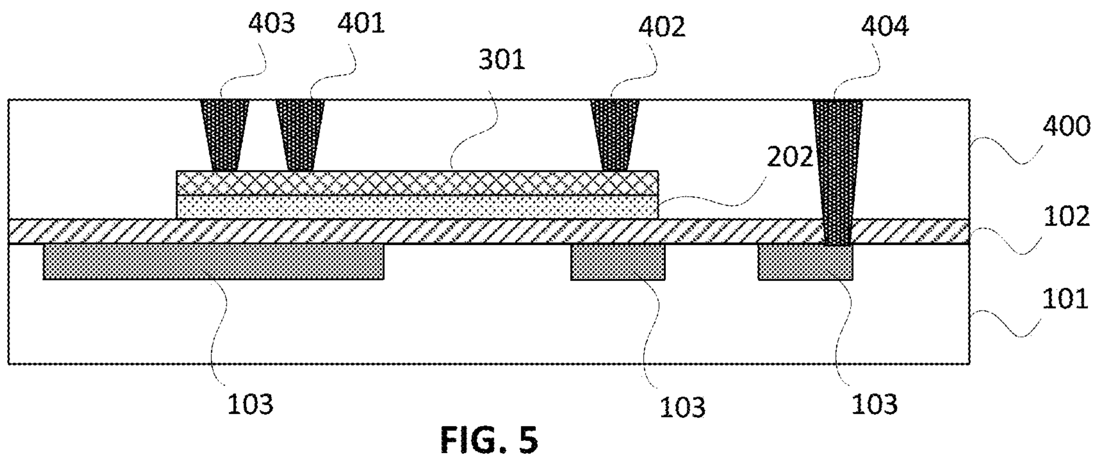

As being illustrated in FIG. 5, embodiment of present invention provides depositing a dielectric layer 400 covering the layer 202, made from the first layer 201, and the second layer 301 of resistive material. Subsequently, two or more via contacts may be formed inside the dielectric layer 400 such that at least a first via contact 401 is in contact with the second layer 301 at a first side and a second via contact 402 is in contact with the second layer 301 at a second side. Additional via contact such as a third via contact 403 may be formed at the first side of the second layer 301 as well, and a fourth via contact 404 may be formed, for example, to provide contact to the metal line 103 in the dielectric layer 101. The via contacts may be formed through a lithographic patterning, etching, and deposition process in a single damascene step. The first via contact 401 and the second via contact 402 may be formed to be separated by a distance of about 120 nm or more. The first via contact 401 and the second via contact 402 may provide electric contacts to the second layer 301 such that electric current may pass through the resistive material of the second layer 301 in a direction from, for example, the first via contact 401 to the second via contact 402. Joule heating generated during the passing of electric current, through the second layer 301, may be mitigated by the highly thermally conductive layer 202 of the first layer 201.

Figure 6:
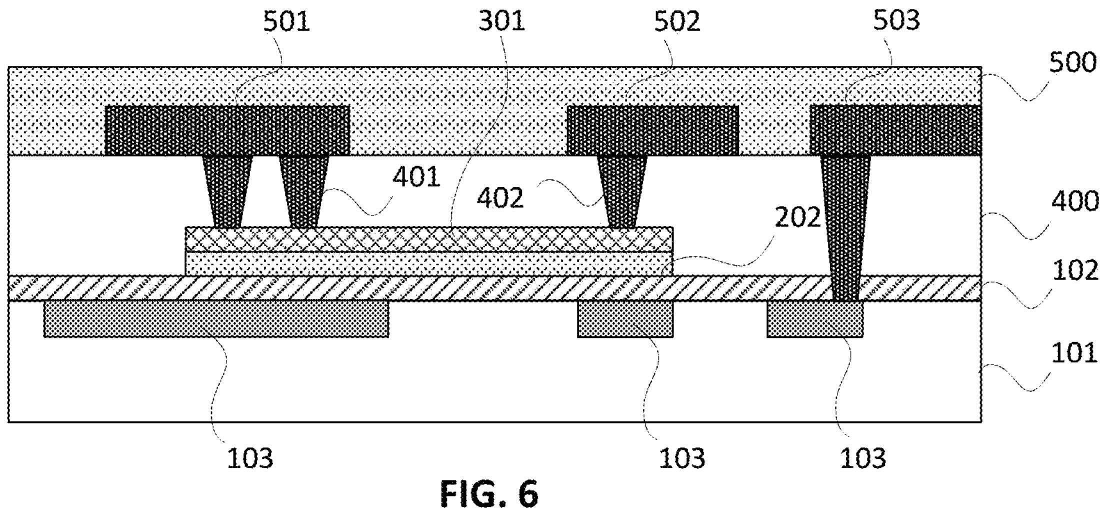

As being illustrated in FIG. 6, embodiment of present invention further provides depositing another dielectric layer 500 on top of the dielectric layer 400, and forming one or more metal lines 501, 502, and 503, for example, and/or other metallic contacts inside the dielectric layer 500. The metal lines 501, 502, and 503 may be formed through a lithographic patterning, etching, and deposition process such as a single damascene step. The metal lines 501, 502, and 503 may be formed to contact the first, second, third and fourth via contacts 401, 402, 403, and 404. For example, the metal line 501 may contact the first via contact 401 and the third via contact 403 and the metal line 502 may contact the second via contact 402. Electric current may be provided through the metal line 501, through the first and third via contacts 401 and 403, through the second layer 301 of resistive material, through the second via contact 402, and finally exit at the metal line 502. Alternatively, electric current may flow in an opposite direction from the metal line 502, the second via contact 402, the second layer 301, the first and third via contacts 401 and 403, and exit at the metal line 501. The metal line 503 may be formed to contact the fourth via contact 404.

In the above, the first, second, third, and fourth via contacts 401, 402, 403, and 404 and the metal lines 501, 502, and 503 are described as being formed separately through two separate single damascene steps. However, embodiments of present invention are not limited in this aspect. For example, one or more of the first, second, third, and fourth via contacts 401, 402, 403, and 404 and one or more of the metal lines 501, 502, and 503 may be formed together in a single process such as a dual damascene patterning process or in any combinations of single damascene and dual damascene processes.

FIGS. 7-9 are demonstrative illustrations of cross-sectional views of a resistor structure during a process of manufacturing thereof, following the step illustrated in FIG. 3, according to another embodiment of present invention. More specifically, FIG. 7 illustrates, following the deposition or forming of the second layer 301 of resistive material in FIG. 2, embodiment of present invention provides forming a third layer 203 of electrically insulating material with high thermal conductivity directly on top of the second layer 301. The third layer 203 may be a same material as that of the first layer 201 but embodiments of present invention are not limited in this aspect and different materials of electrically insulative with high thermal conductivity may be used for the first layer 201 and the third layer 203.

The third layer 203 may be formed to have a thickness ranging from about 5 nm to about 500 nm. The third layer 203, together with the first layer 201, may fully encompass the second layer 301 of resistive material. Together, the third layer 203 and the first layer 201 provide improved capability of heat dissipation, over currently existing art, for the second layer 301 when the second layer 301 being used as a resistor, thereby reducing the probability of failure or break-down of the second layer 301 due to, for example, electromigration.

In one embodiment, as being illustrated in FIG. 8, the stack of the first layer 201 and the third layer 203 may be patterned, through a lithographic patterning and etching process, to become a layer 204 and a layer 205 respectively and have an area that is either equal to the second layer 301 or larger than the second layer 301 but less than when they were originally deposited. In one embodiment, the patterning and etching of the first layer 201 and the third layer 203 may be optional depending upon the design and use of the second layer 301 as a resistor.

As being illustrated in FIG. 9, embodiments of present invention further provide forming or depositing one or more dielectric layers such as dielectric layers 400 and 500 on top of and covering the first layer 201 and the third layer 203 (or the layer 204 and the layer 205 as in FIG. 9) of electrically insulating material with high thermal conductivity; forming two or more via contacts such as a first via contact 401 and a second via contact 402 through layer 205 to be in contact with second layer 301; and forming metal lines such as metal lines 501 and 502 on top of and in contact with the first via contact 401 and the second via contact 402. As being discussed above, the first and second via contacts 401 and 402 and the metal lines 501 and 502 may be formed through either a single damascene process, a dual damascene process, or any other BEOL metallization process.

Figures 10, 11, 12:
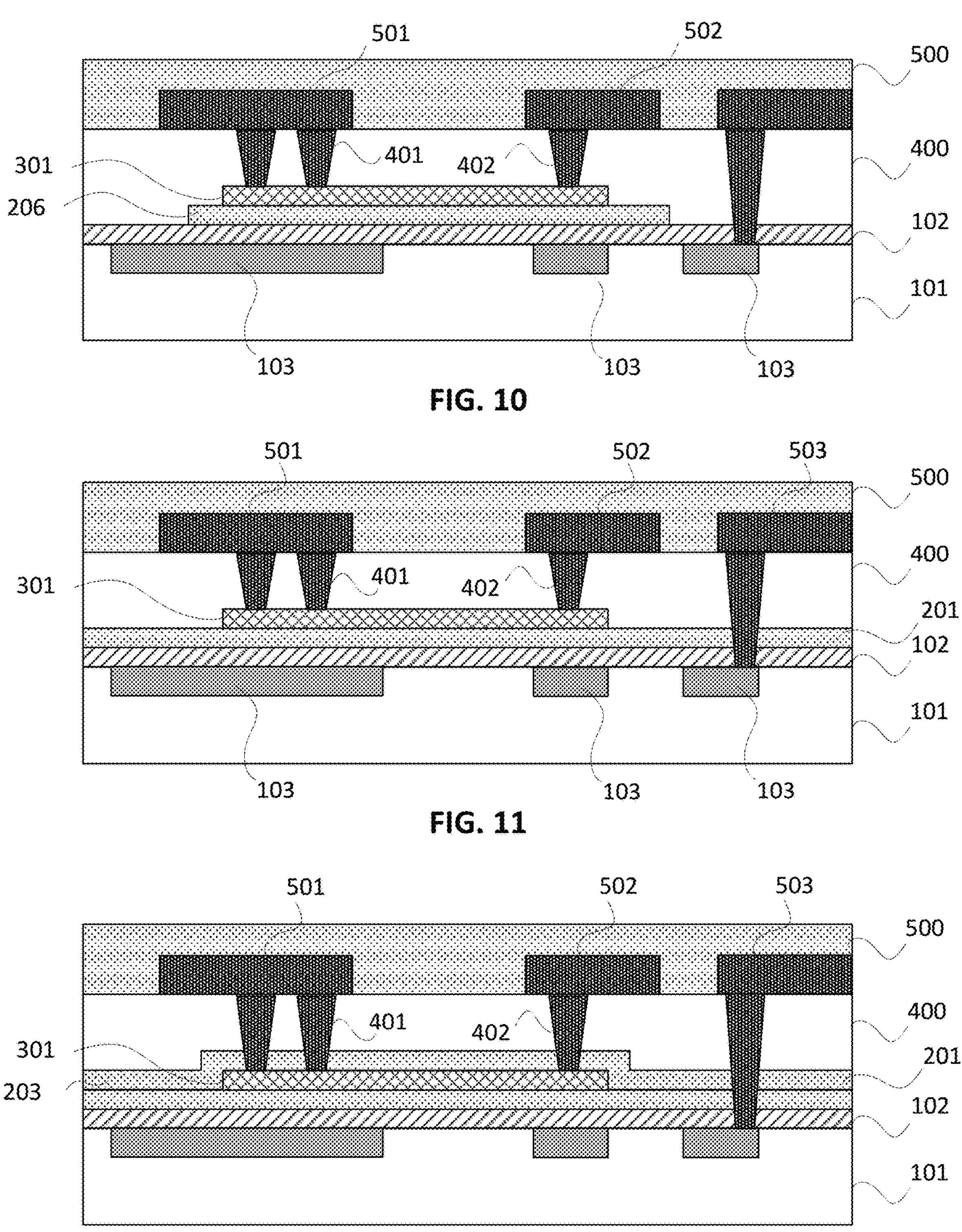
FIG. 10 is a demonstrative illustration of cross-sectional view of a resistor structure during a process of manufacturing thereof, following the step illustrated in FIG. 3, according to yet another embodiment of present invention.
FIG. 11 is a demonstrative illustration of cross-sectional view of a resistor structure during a process of manufacturing thereof, following the step illustrated in FIG. 3, according to another embodiment of present invention.
FIG. 12 is a demonstrative illustration of cross-sectional view of a resistor structure during a process of manufacturing thereof, following the steps illustrated in FIG. 7, according to yet another embodiment of present invention.

FIG. 10 is a demonstrative illustration of cross-sectional view of a resistor structure during a process of manufacturing thereof, following the step illustrated in FIG. 3, according to yet another embodiment of present invention. As being described above in conjunction with FIG. 3 and FIG. 4, the first layer 201 may be patterned to become a layer 206 having an area larger than and surrounding (when viewed from a top) the second layer 301. Following the patterning of the first layer 201, via contacts such as first and second via contacts 401 and 402 and metal lines such as metal lines 501 and 502 may be formed to provide electrical access to resistor of second layer 301 using processes as being described above.

FIG. 11 is a demonstrative illustration of cross-sectional view of a resistor structure during a process of manufacturing thereof, following the step illustrated in FIG. 3, according to another embodiment of present invention. As being described above in conjunction with FIG. 3 and FIG. 4, in one embodiment, no etching of the first layer 201 may be performed which stays as being deposited. Via contacts such as first and second via contacts 401 and 402 and metal lines such as metal lines 501 and 502 may be formed to provide electrical access to resistor of the second layer 301 using processes as being described above.

FIG. 12 is a demonstrative illustration of cross-sectional view of a resistor structure during a process of manufacturing thereof, following the steps illustrated in FIG. 7, according to yet another embodiment of present invention. As being described above in conjunction with FIG. 7, in one embodiment, no etching of the first layer 201 and the third layer 203, which stays on top of the first layer 201, is performed. The first layer 201 and the third layer 203 both stay as being deposited. Via contacts such as first and second via contacts 401 and 402 and metal lines such as metal lines 501 and 502 may be formed to provide electrical access to resistor of second layer 301 using processes as being described above. More particularly, the first and second via contacts 401 and 402 are made through the third layer 203 to land directly on top of the second layer 301 of resistive material which functions as a resistor.

Figure 13:
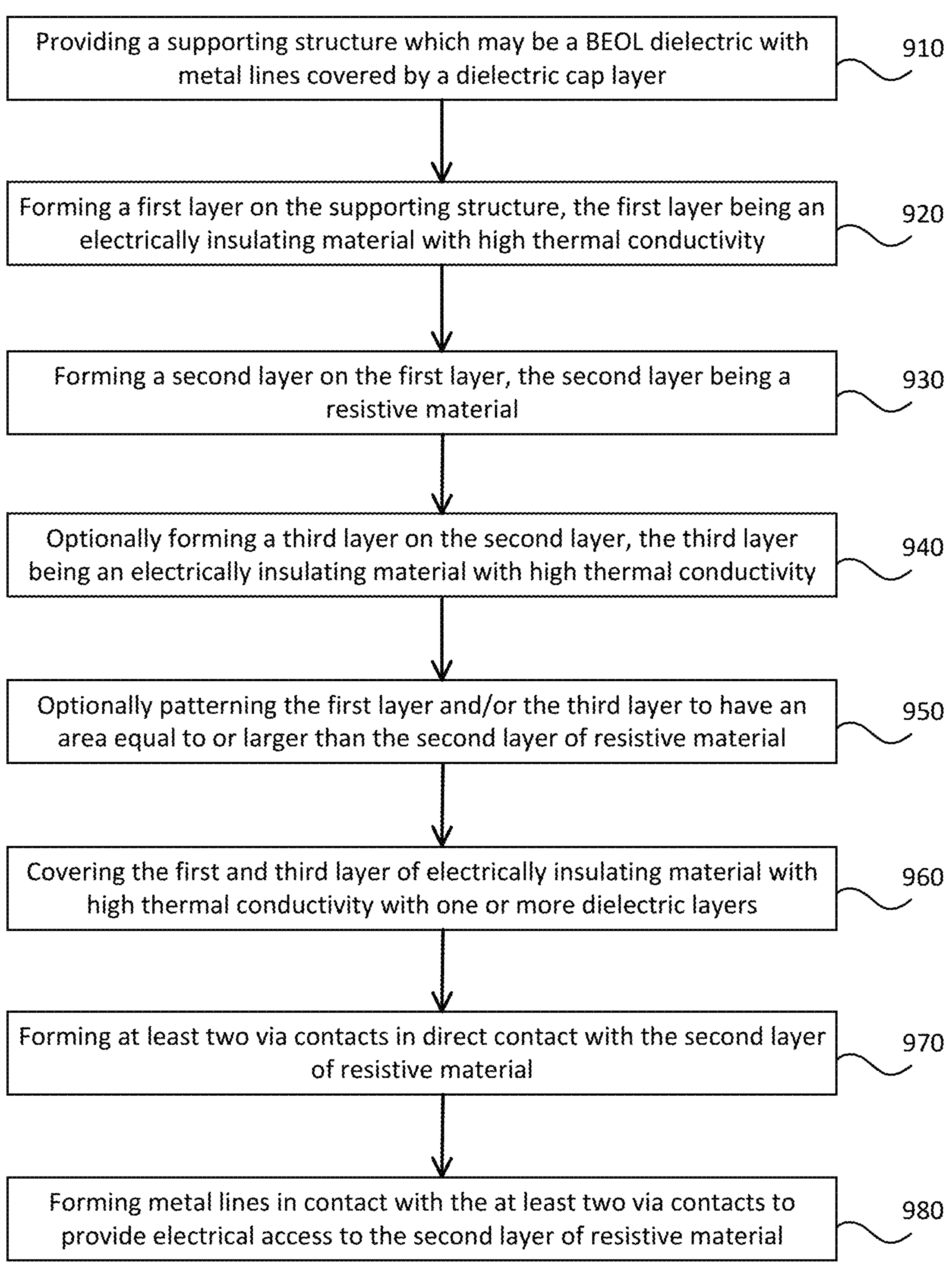
FIG. 13 is a demonstrative illustration of a flow-chart of a method of manufacturing a resistor structure according to embodiments of present invention.

FIG. 13 is a demonstrative illustration of a flow-chart of a method of manufacturing a resistor structure according to embodiments of present invention. More specifically, embodiments of present invention provide (910) providing a supporting structure which may be a BEOL dielectric with metal lines and may be covered by a dielectric cap layer; (920) forming a first layer, which may be a layer of electrically insulating material with high thermal conductivity, on top of the supporting structure; (930) forming a second layer, which may be a layer of resistive material such as TiN, TaN, TiAlN, SiCr and other silicide materials, on top of the first layer; (940) optionally forming a third layer, which may be a layer similar to the first layer and may be of electrically insulating material with high thermal conductivity, on top of the second layer; (950) optionally patterning the first layer, and/or the third layer of electrically insulating material with high thermal conductivity such that they have an area that is either equal to or larger than that of the second layer of resistive material; (960) covering the first and third layers of electrically insulating material with high thermal conductivity with one or more dielectric layers; (970) forming at least two via contacts to be in direct contact with the second layer of resistive material and, in the case where the third layer is covering the second layer, the at least two via contacts going through the third layer to be in direct contact with the second layer; and (980) forming metal lines in contact with the at least two via contacts to provide electrical access to the second layer of resistive material, which forms a BEOL resistor. It is to be noted here that the via contacts and metal lines may be formed in separate steps or a single step through a dual damascene patterning and etching process.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A resistor structure comprising:

a first layer of electrically insulating material;

a second layer of resistive material directly adjacent to the first layer; and a first and a second via contact in contact with the second layer of resistive material, wherein a thermal conductivity of the first layer is equal to or larger than 100 W/m/K; the second layer of resistive material has a width of about 100 nm; and the first via contact and the second via contact are separated by a distance of about 120 nm.

2. The resistor structure of claim 1, wherein the first layer of electrically insulating material has a band gap equal to or larger than 4 eV.

3. The resistor structure of claim 1, wherein the first layer of electrically insulating material is selected from a group consisting of aluminum-nitride (AlN), boron-nitride (BN), and diamond (C).

4. The resistor structure of claim 1, wherein the first layer of electrically insulating material has a thickness of at least 5 nm, and wherein the second layer of resistive material has a thickness from about 10 nm to about 200 nm.

5. The resistor structure of claim 1, wherein the first layer of electrically insulating material is directly underneath the second layer and has an area equal to or larger than the second layer.

6. The resistor structure of claim 1, further comprising a third layer of electrically insulating material, the third layer directly adjacent to the second layer and opposite to the first layer.

7. The resistor structure of claim 6, wherein the first and third layers of electrically insulating material fully encompass the second layer of resistive material.

8. The resistor structure of claim 7, wherein the second layer of resistive material has a width of about 100 nm, the first and the second via contact passing through the third layer of electrically insulating material and in contact with the second layer of resistive material, the first via contact and the second via contact are at least 120 nm separated.

9. A resistor structure comprising:

a first layer of electrically insulating material;

a second layer of resistive material directly above and in contact with the first layer, the first layer having an area equal to or larger than that of the second layer; and a third layer of electrically insulating material directly on top of the second layer, wherein the first and third layers fully encompass the second layer, wherein the first layer of electrically insulating material has a thickness of at least 5 nm, and wherein the second layer of resistive material has a width of about 100 nm and a thickness between about 10 nm to about 200 nm.

10. The resistor structure of claim 9, wherein the electrically insulating material of the first layer is selected from the group consisting of aluminum-nitride (AlN), boron-nitride (BN), and diamond (C); and the resistive material of the second layer is titanium-nitride (TiN), tantalum-nitride (TaN), titanium-aluminum-nitride (TiAlN), or silicon-chromium (SiCr).

11. The resistor structure of claim 9, wherein the first layer has a thermal conductivity equal to or larger than 100 W/m/K and a band gap equal to or larger than 4 eV.

12. The resistor structure of claim 9, further comprising a first and a second via contact, the first and second via contacts passing through the third layer of electrically insulating material and in direct contact with the second layer of resistive material.

13. The resistor structure of claim 12, wherein the first and third layers are aluminum-nitride (AlN) and the first via contact and the second via contact are separated by a distance of at least 120 nm.

14. A method of forming a resistor structure comprising:

forming a first layer of electrically insulating material on top of a supporting structure;

forming a second layer of resistive material directly on top of and in contact with the first layer of electrically insulating material; and forming a first and a second via contact in contact with the second layer of resistive material, wherein the first layer of electrically insulating material has a thermal conductivity equal to or larger than 100 W/m/K; the second layer of resistive material has a width of about 100 nm; and the first via contact and the second via contact are separated by a distance of about 120 nm.

15. The method of claim 14, wherein the first layer of electrically insulating material is selected from a group consisting of aluminum-nitride (AlN), boron-nitride (BN), and diamond (C).

16. The method of claim 14, further comprising forming a third layer of electrically insulating material directly on top of the second layer of resistive material, wherein the third layer has a thermal conductivity equal to or larger than that of the first layer and has a band gap equal to or larger than that of the first layer; and the first and third layers together fully encompass the second layer of resistive material.

17. The method of claim 14, further comprising patterning the first and second layers to have a same width and a same length.

* * * * *